United States Patent
Matsunaga et al.

(10) Patent No.: US 6,540,469 B2
(45) Date of Patent: Apr. 1, 2003

(54) SUBSTRATE PROCESSING APPARATUS

(75) Inventors: Tatsuhisa Matsunaga, Tokyo (JP); Kouichi Noto, Tokyo (JP)

(73) Assignee: Hitachi Kokusai Electric Inc., Tokyo (JP)

(*) Notice: Subject to any disclaimer, the term of this patent is extended or adjusted under 35 U.S.C. 154(b) by 10 days.

(21) Appl. No.: 09/945,643

(22) Filed: Sep. 5, 2001

(65) Prior Publication Data

US 2002/0037210 A1 Mar. 28, 2002

(30) Foreign Application Priority Data

Sep. 5, 2000 (JP) ........................ 2000-268036

(51) Int. Cl.$^7$ ............................................. B65G 49/07
(52) U.S. Cl. .................. 414/416.08; 414/217; 414/811; 414/937
(58) Field of Search ................................. 414/152, 160, 414/217, 416.08, 804, 805, 811, 937

(56) References Cited

U.S. PATENT DOCUMENTS

| | | | | |
|---|---|---|---|---|
| 4,770,590 A | * | 9/1988 | Hugues et al. .............. | 414/172 |
| 5,180,273 A | * | 1/1993 | Sakaya et al. .............. | 414/404 |
| 5,221,201 A | * | 6/1993 | Yamaga et al. ............. | 432/241 |
| 5,234,528 A | * | 8/1993 | Nishi ..................... | 156/345.31 |
| 5,536,320 A | * | 7/1996 | Ushikawa et al. .......... | 118/719 |
| 5,562,383 A | * | 10/1996 | Iwai et al. ................ | 414/217.1 |
| 5,565,034 A | * | 10/1996 | Nanbu et al. .............. | 118/668 |
| 5,829,969 A | * | 11/1998 | Miyashita et al. .......... | 432/253 |
| 6,390,753 B1 | * | 5/2002 | De Ridder ................ | 414/160 |
| 2001/0016307 A1 | * | 8/2001 | Ishii ..................... | 432/239 |

FOREIGN PATENT DOCUMENTS

| | | | |
|---|---|---|---|
| JP | 2-263454 | * | 10/1990 |
| JP | 3-085723 | * | 10/1991 |
| JP | 6-127621 | * | 5/1994 |
| JP | 9-289173 | * | 11/1997 |

* cited by examiner

Primary Examiner—James W. Keenan
(74) Attorney, Agent, or Firm—Bacon & Thomas, PLLC

(57) ABSTRACT

A substrate processing apparatus includes a process tube for processing a plurality of substrates, two boats for accommodating the substrates, two boat elevators, a substrate transfer unit for loading and unloading the substrates into and from the boats when the boats are at the first position. In this apparatus, each boat elevator has one boat mounted thereon and each of the boat elevators carries a corresponding boat between a first position located below the process tube and two corresponding second positions. Each of the boat elevators performs loading and unloading the corresponding boat into and from the process tube at the first position. Further, in the apparatus, a center position of the process tube is disposed inside a triangle formed by connecting the substrate transfer unit and the two boat elevators.

12 Claims, 15 Drawing Sheets

SUBSTRATE PROCESSING APPARATUS

FIELD OF THE INVENTION

The present invention relates to a substrate processing apparatus; and, more particularly, to a substrate processing apparatus capable of suppressing oxidation and contamination of a substrate under processing.

BACKGROUND OF THE INVENTION

In a semiconductor device manufacturing factory, there have been widely employed batch-type vertical hot-wall furnaces (from now on, referred to as furnaces) in a thermal process such as an annealing, an oxide film forming, a diffusion or a thin film forming process on a semiconductor wafer.

U.S. Pat. No. 4,770,590 discloses one of such furnaces. In this furnace, a boat exchanger is installed between a wafer transfer unit and the space just under a process tube and there are mounted a pair of boats on a turning table of the boat exchanger, wherein a processed boat is substituted with an unprocessed boat by turning the pair of boats by 180° on the turning table with respect to a boat elevator. Namely, in this furnace, while one boat (a first boat) accommodating a set of wafers is processed in the process tube, new wafers (unprocessed wafers) are mounted on the other boat (a second boat) and then transferred by a wafer transfer unit to thereby enhance a throughput thereof.

In this conventional furnace, however, impurities, e.g. contaminants, may be produced during the exchange operation of the boats. Further, since the boats are not fixedly mounted on the turning table, it may be possible that the boats may fall down during the exchange operation thereof or due to an external impact, e.g., an earthquake.

Further, Japanese Patent Laid Open Publication No. 9-289173 discloses a vertical hot-wall furnace including a first boat elevator for mounting and transferring a first boat having wafers mounted thereon between a wafer transfer region and a process tube and a first boat elevator for mounting and transferring a second boat having wafers mounted thereon between the wafer transfer region and the process tube, wherein a boat exchange operation is not executed with respect to a boat elevator such as one disclosed in the above-mentioned U.S. Pat. No. 4,770,590 to thereby enhance a throughput thereof.

Meanwhile, in the a vertical hot-wall furnace disclosed in the Japanese Patent Laid Open Publication No. 9-289173, since the boat exchange operation is not executed with respect to the boat elevator, there entails no position deviation problem and accordingly, the boat capsize problem is prevented. However, since a center position of a heat processing chamber is located on a straight line passing through a position of the first boat elevator and a position of the second boat elevator, a distance between the first boat elevator and the second boat elevator becomes about two times of each arm (rotating unit) of the boat elevators.

This requires an increase a horizontal width (opening) of the vertical hot-wall furnace to thereby increase a dimension thereof. Further, since wafers in the first and second boats transferred from the process tube to preset positions apart therefrom by the first and second boat elevators are carried by a wafer transfer unit, the carrying area of the wafer transfer unit becomes larger and accordingly, footprint (occupying area) thereof becomes large.

SUMMARY OF THE INVENTION

It is, therefore, an object of the present invention to provide a semiconductor manufacturing apparatus capable of preventing or reducing generation of impurities and avoiding the tripping or the falling down of boats.

Another object of the present invention is to provide a semiconductor manufacturing apparatus capable of preventing unprocessed boats from being affected by the heat generated from processed boats.

In accordance with a first preferred embodiment of the present invention, there is provided a substrate processing apparatus comprising: a process tube for processing a plurality of substrates; two boats for accommodating the substrates; two boat elevators, each having one boat mounted thereon, the boat elevators carrying the boats between a first position located below the process tube and two corresponding second positions and loading and unloading the boats into and from the process tube at the first position; and a substrate transfer unit for loading and unloading the substrates into and from the boats when the boats are at the first position, wherein a center position of the process tube is disposed inside a triangle formed by connecting the substrate transfer unit and the two boat elevators.

In accordance with the first embodiment, since a center position of the process tube is disposed inside a triangle formed by connecting the substrate transfer unit and the two boat elevators, the space between the two boat elevators can be saved to thereby decrease a horizontal width of the substrate processing apparatus. Further, since the substrate transfer unit can transfer wafers accommodated in any of the two boats at the first position, wafers can be transferred with respect to any of the two boats at one heat treatment stage. This results in saving of a moving area of the substrate transfer unit to thereby decrease the footprint thereof.

In accordance with a second preferred embodiment of the present invention, there is provided a substrate processing apparatus comprising: a substrate processing apparatus comprising: a process tube for processing a plurality of substrates; two boats for accommodating the substrates; two boat elevators for carrying the boats between a first position located below the process tube and two corresponding second positions and loading and unloading the boats into and from the process tube at the first position; and a substrate transfer unit for loading and unloading the substrates into and from the boats, wherein the boat elevators are located at both sides of a line passing through a center of the process tube and the substrate transfer unit and one of the boats is moved by its corresponding boat elevator toward the substrate transfer unit from the first position and the other boat is moved by its corresponding boat elevator toward the opposite side of the substrate transfer unit from the first position.

In the second embodiment, the boat elevators are located at both sides of a line passing through a center of the process tube and the substrate transfer unit and one of the boats is moved by its corresponding boat elevator toward the substrate transfer unit from the first position and the other boat is moved by its corresponding boat elevator toward the opposite side of the substrate transfer unit from the first position. As a result, a horizontal width and a footprint of the substrate processing apparatus can be saved.

In accordance with the first and second embodiments, since the boat elevator can transfer the boats between the first position located below the process tube and the two corresponding second positions, the boat fixedly mounted on the boat elevator can be loaded and unloaded into and from the process tube. Accordingly, the generation of impurity particles can be avoided when a processed boat and an unprocessed boat are exchanged. Further, a capsize problem can be overcome during the exchange operation or an earthquake generation.

In accordance with a third preferred embodiment of the present invention, there is provided a substrate processing apparatus comprising: two process tubes for processing a plurality of substrates; four boats for accommodating the substrates; four boat elevators, each boat elevator for loading and unloading one of the boats into and from one of the process tubes and carrying said one of the boats between one of two first positions below the process tubes and one of three corresponding second positions; and a substrate transfer unit for loading and unloading the substrates into and from the boats.

BRIEF DESCRIPTION OF THE DRAWINGS

The above and other objects and features of the present invention will become apparent from the following description of preferred embodiments given in conjunction with the accompanying drawings in which.

DETAILED DESCRIPTION OF THE PREFERRED EMBODIMENTS

Preferred embodiments of the present invention will now be described with reference to FIGS. 1–15. A semiconductor manufacturing apparatus in accordance with a preferred embodiment of the present invention is a batch-type vertical hot-wall furnace (from now on, referred to as a furnace), e.g., a chemical vapor deposition (CVD) apparatus, which is employed in depositing a CVD film on an wafer serving as a substrate. In the following description for the preferred embodiments, front and back, left and right sides are defined with reference to FIG. 1. Namely, the lower side where a pod stage 8 is located is referred to as a front side and its opposite side is referred to as a backside. The left-hand side where a clean unit 3 is disposed is referred to as a left side and its opposite side is referred to as a right side.

Figure 1:
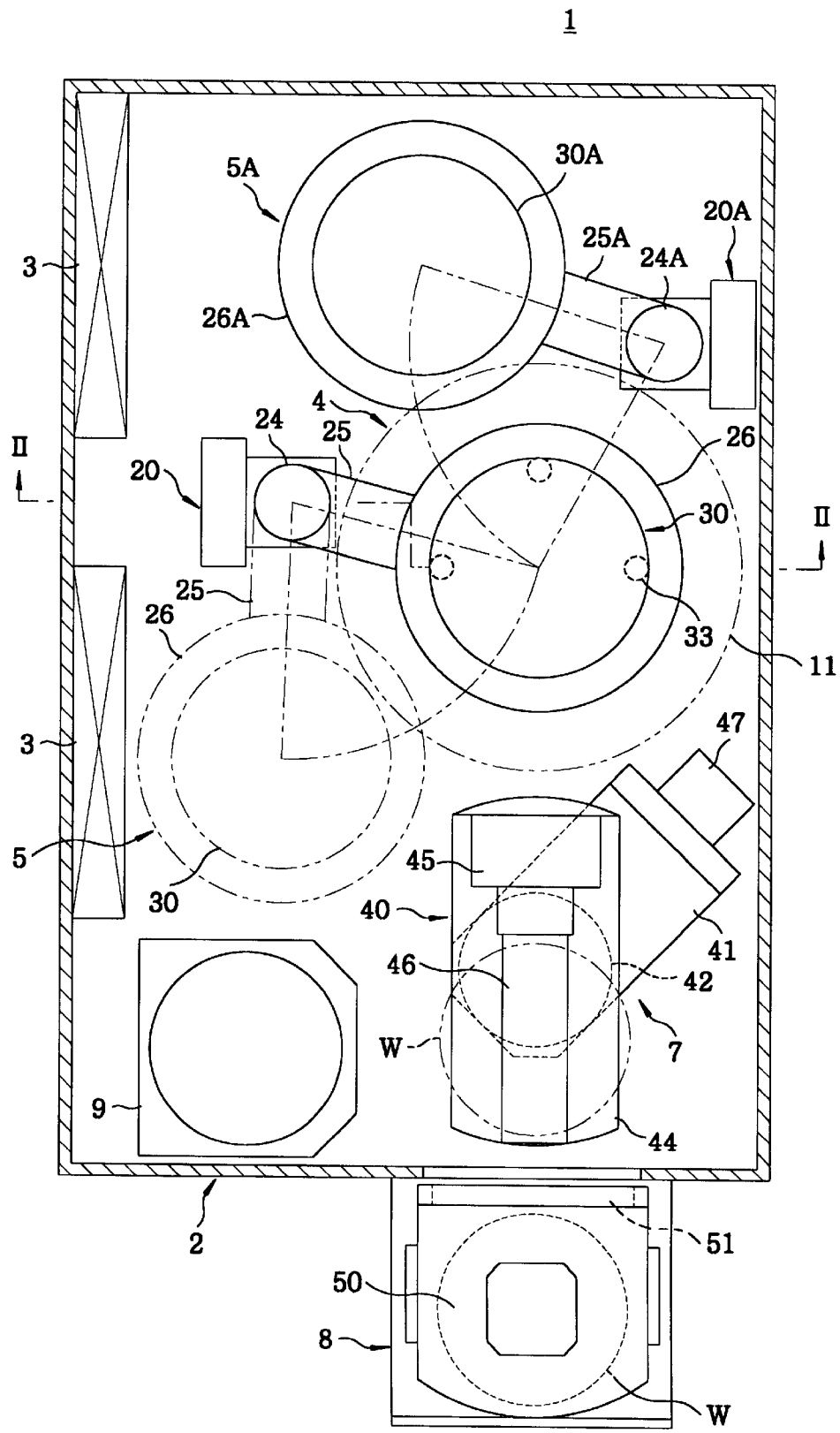
FIG. 1 shows a schematic plan view of a chemical vapor deposition (CVD) apparatus in accordance with a first preferred embodiment of the present invention.

As shown in FIG. 1, a CVD apparatus 1 includes a housing body 2 of substantially a hexahedral box shape having a rectangle cross sectional shape. Two clean units 3 are of a same height installed horizontally on the left side wall of the housing body 2. The clean units 3 provide clean air toward their corresponding retreat stages, respectively.

A heat treatment stage 4 is set around a center portion in the housing body 2. A first retreat stage 5 and a second retreat stage 5A are set at a front left side and a rear left side of the heat treatment stage 4, respectively.

A wafer loading stage 7 is set at a right front corner of the housing body 2. A pod stage 8 is set in front of the wafer loading stage 7. A notch arrangement unit 9 to arrange a notch (not shown) of a wafer is located at a left front corner of the housing body 2. From now on, structures of the above stages will be described in detail.

Figure 2:
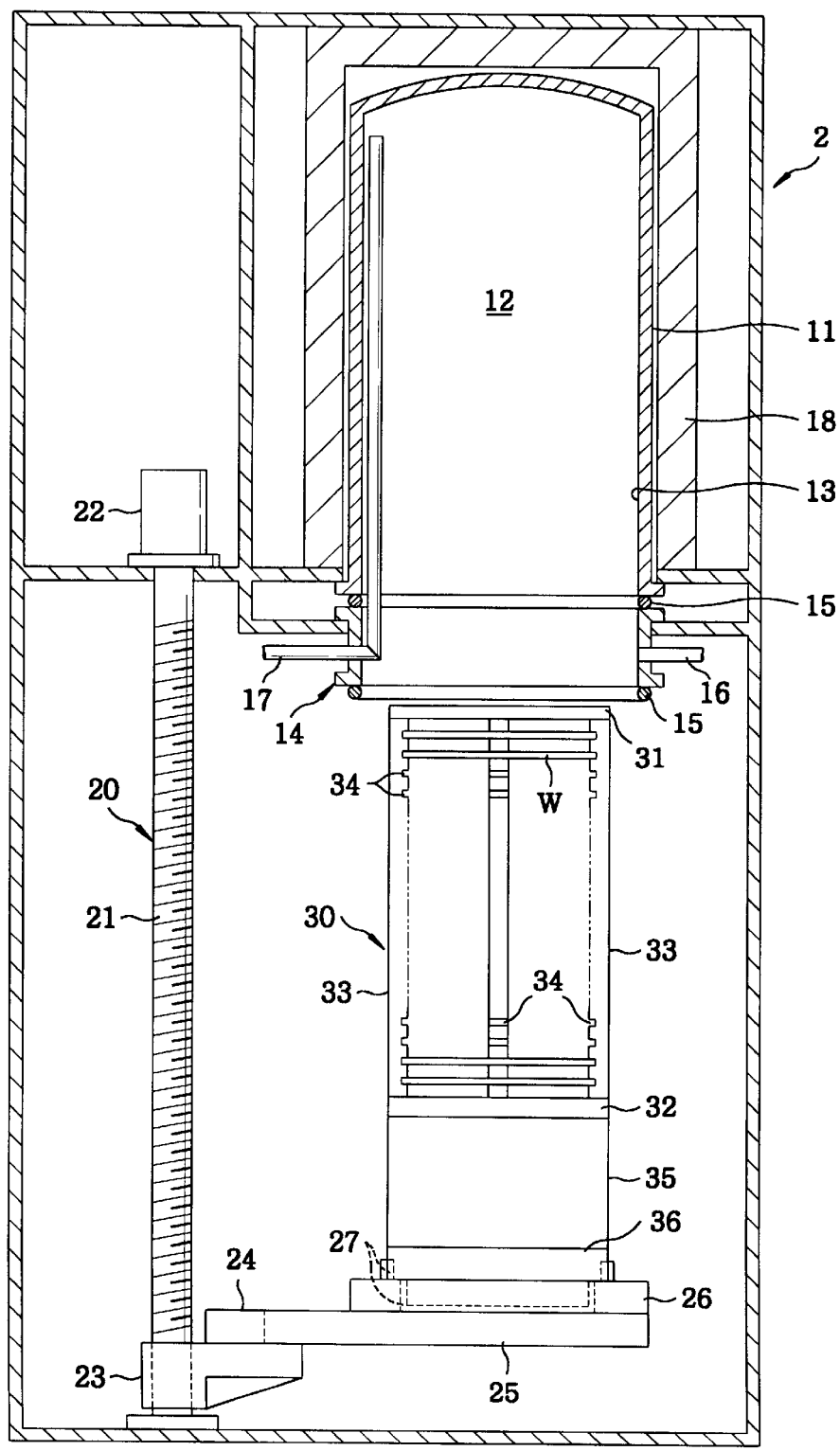
FIG. 2 depicts a vertical cross sectional view of the CVD apparatus taken along a line II—II as shown in FIG. 1.
Figure 3:
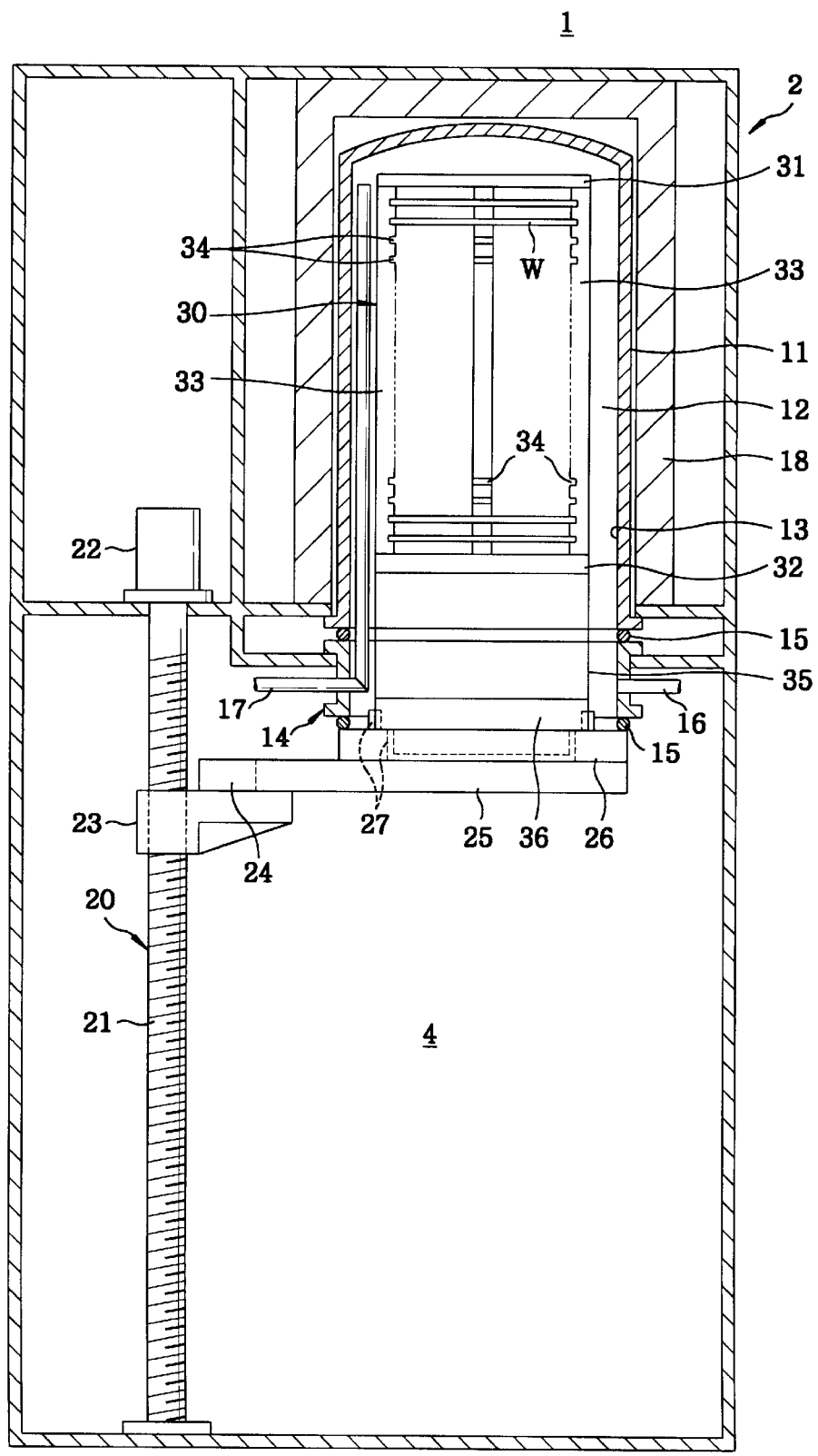
FIG. 3 provides a vertical cross sectional view of the CVD apparatus during a wafer processing therein in accordance with the first preferred embodiment.

As illustrated in FIGS. 2 and 3, a process tube 11 formed as a single body made of, e.g., quartz is vertically installed at an upper part of the heat treatment stage 4, the process tube 11 having a shape of cylinder whose lower part being opened. The hollow part of the process tube 11 forms a processing room 12 into which a plurality of wafers concentrically arranged in a boat are loaded. The bottom opening of the process tube 11 serves as a throat 13 for loading and unloading wafers therethrough.

The lower part of the process tube 11 is coupled with an upper part of a manifold 14 through a seal ring 15 therebetween. The manifold 14 is supported by the housing body 2. As a result, the process tube 11 is vertically supported. Installed through the side wall of the manifold 14 as illustrated in FIG. 2 are an exhaust pipe 16 for evacuating the processing room 12 at a desired vacuum level and a gas inlet line 17 for supplying a source gas or a nitrogen gas into the processing room 12. Outside the process tube 11, a heater unit 18 for heating the processing room 12 is concentrically installed around the process tube 11. The heater unit 18 is vertically supported by the housing body 2.

A first boat elevator 20 to transfer a first boat 30 between the heat treatment state 4 and the first retreat stage 5 is installed at a back position between the heat treatment stage 4 and the first retreat stage 5. A second boat elevator 20A is installed next to the heat treatment stage 4 and the second retreat stage 5A to transfer the second boat 30A between the heat treatment state 4 and the second retreat stage 5A.

In detail, the first and second boat elevators 20 and 20A are located at both sides of a line passing through the heat treatment stage 4 (a center of the process tube 11) and the wafer loading stage 7 (a wafer transfer unit 40 which is described later). The first and second boat elevators 20 and 20A transfer corresponding boats toward the wafer loading stage 7 and toward the opposite side of the wafer loading stage 7, respectively.

Further, a center position of the process tube 11 is disposed inside a triangle formed by connecting the wafer loading stage 7, the boat elevator 20 and the boat elevator 20A. Center positions of the first boat 30 and the second boat 30A are located at one side (left side in this embodiment) of a straight line passing through the wafer loading stage 7 and the center position of the process tube 11.

Since the first and the second boat elevators 20, 20A and the first and the second boats 30, 30A are identically structured and function similarly, only the first boat elevator 20 and the first boat 30 will be described in detail with reference to FIGS. 2 and 3.

As shown in FIGS. 2 and 3, the first boat elevator 20 is installed at a predetermined position in the housing body 2. The first boat elevator 20 has a rotatably supported transfer screw shaft 21 which can be rotated in clockwise and counterclockwise directions by an electric motor 22. An elevator support 23 is screw-coupled with the transfer screw shaft 21, thereby enabling the elevator support 23 to move up and down by the revolution of the transfer screw shaft 21. A rotary actuator 24 is horizontally mounted on the elevator support 23. A cap 26 is fixedly mounted in horizontal direction on the arm 25 to support the vertically installed first boat 30. A fixing part 27 is prepared on the cap 26 to fix the first boat 30. The fixing part 27 serves to fix the first boat 30 but is confined to be able to release the first boat 30 for maintenance, e.g., cleaning of the first boat 30.

As illustrated in FIGS. 2 and 3, the first boat 30 has an upper end plate 31, a lower end plate 32 and a plurality of, e.g., three, supporting members 33 vertically arranged between the upper end plate 31 and the lower end plate 32. Each of the supporting members 33 is provided with a multiplicity of, e.g., 100 to 200, vertically spaced wafer holding slots 34 for receiving and holding wafers W. A set of the slots at a same level of the three supporting members serves to hold one wafer.

Periphery portions of the wafers W are inserted in the corresponding supporting slots to thereby render the wafers W to be arranged horizontally and their center lines to be maintained on a same vertical line. A heat insulating cap 35 having a cylindrical shape is installed under the lower end plate 32 of the first boat 30, wherein a base 36 of a disc shape is extruded under the bottom of the heat insulating cap 35. The base 36 is faced with the top surface of the cap 26 of the first boat elevator 20 and fixed by the fixing part 27.

Returning to FIG. 1, there is installed a wafer itransfer unit 40 in the wafer loading stage 7. The wafer transfer unit 40 carries the wafers W among the pod stage 8, the notch arrangement unit 9 and the heat treatment stage 4. In other words, the wafer transfer unit 40 transfers the wafers W between a pod 50, the notch arrangement unit 9 and the boats 30 and 30A.

Figure 4A:
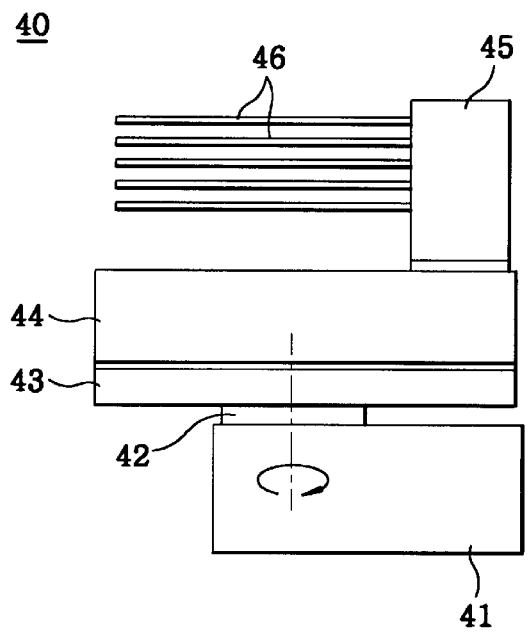
FIGS. 4A and 4B present side views of a wafer transfer unit during a shortened state and an elongated state thereof, 5respectively.
Figure 4B:
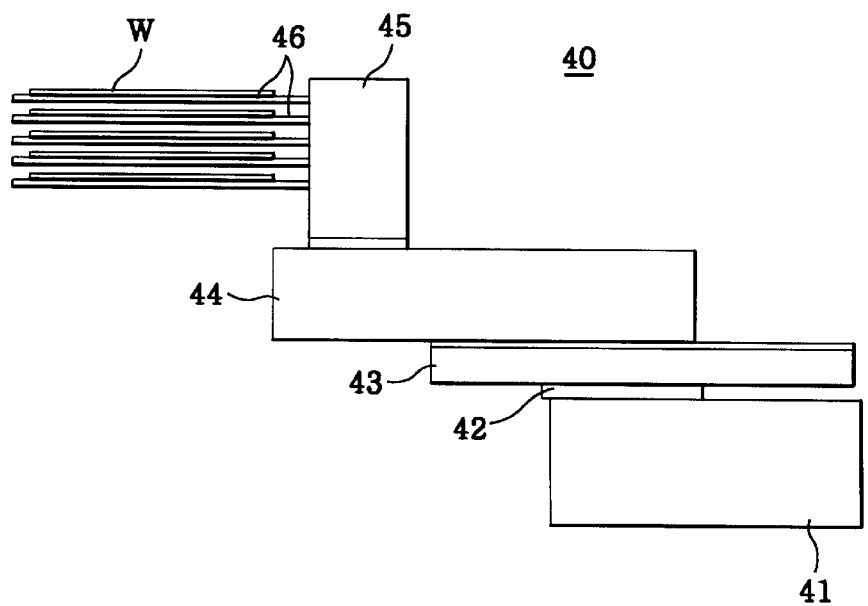

As shown in FIGS. 4A and 4B, the wafer transfer unit 40 includes a base 41, a rotary actuator 42 horizontally mounted on the base 41, a first linear actuator 43 mounted on the rotary actuator 42. A second linear actuator 44 is horizontally mounted on the first linear actuator 43 and an installation unit 45 mounted on the second linear actuator 44.

The rotary actuator 42 serves to rotate the first linear actuator 43 on a horizontal plane. The first linear actuator 43 can linearly reciprocate the second linear actuator 44. The second linear actuator 44 can linearly reciprocate the installation unit 45. A plurality of horizontally elongated tweezers 46 (e.g., five tweezers in FIGS. 4A and 4B) with a constant vertical gap therebetween are mounted onto a side-wall of the installation unit 45. The wafer transfer unit 40 moves up and down by an elevator 47 having a transfer screw mechanism.

Figure 5:
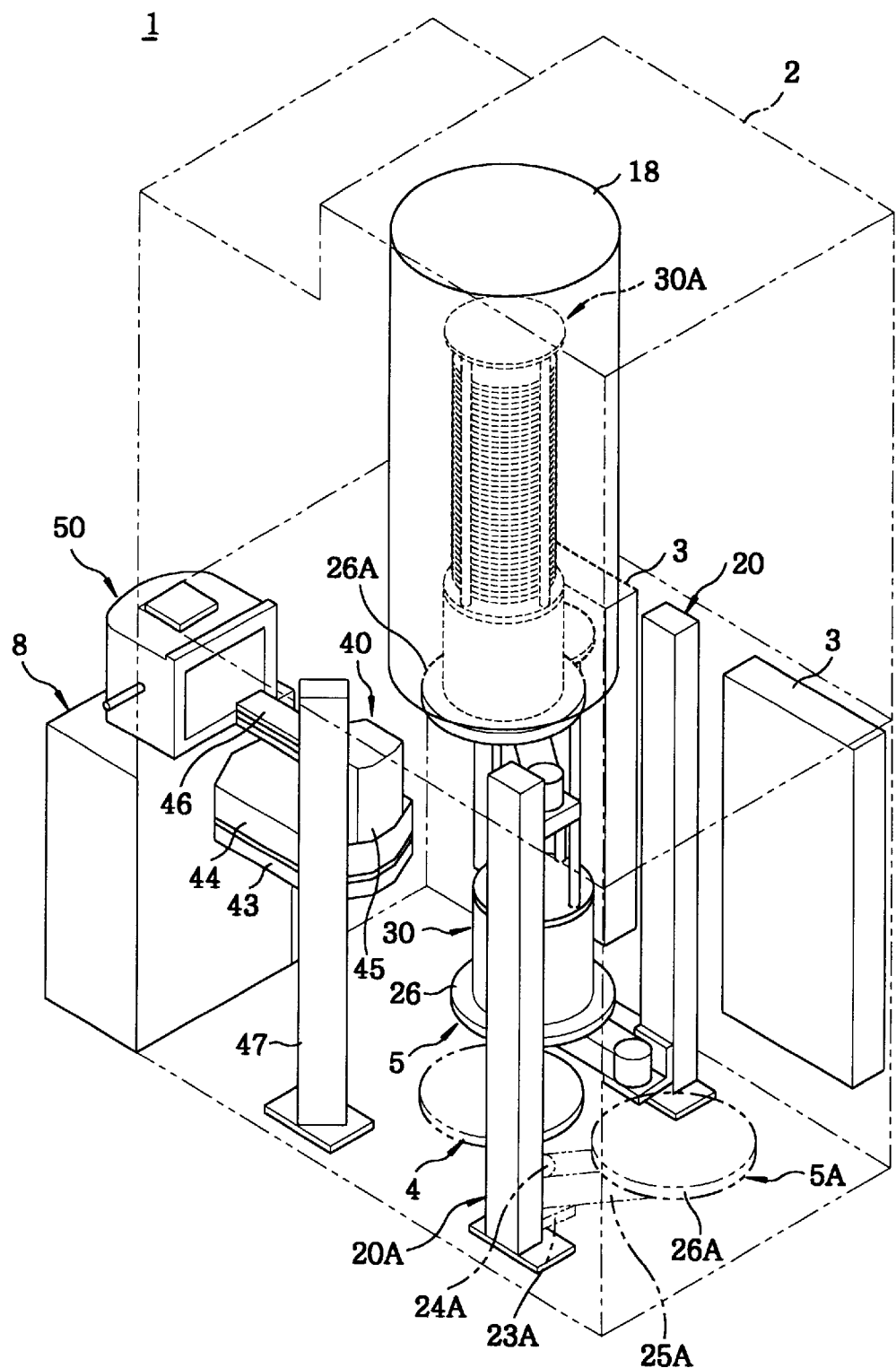
FIG. 5 illustrates a schematic view of the CVD apparatus during processing of a second boat in accordance with the first preferred embodiment of the present invention, which is used in describing a first CVD apparatus managing method.

Mounted on each pod stage 8 is one front opening unified pod (FOUP) 50 serving as a carrier unit (accommodation unit) to carry wafers W. Even though only one pod stage 8 is illustrated in FIGS. 1 and 5 for the sake of simplicity, it should be apparent to those who skilled in the art that more than one pod stage can be provided on the CVD apparatus 1. The pod 50 has a hexahedral box like shape with an opening at one face thereof. A door 51 is detachably mounted on the opening of the pod.

With the use of a pod as a carrier of wafers, the wafers can be kept protected from contaminations in ambient atmosphere while being transferred since the pod containing wafers are airtightly closed. As a result, the degree of cleanliness required for a clean room accommodating a CVD apparatus therein may be lowered, thereby reducing cost for the maintenance of the clean room.

Accordingly, in the CVD apparatus 1 in accordance with the preferred embodiment of the present invention, the pod 50 is used as a carrier of the wafers. Further, there is installed at the pod stage 8 a pod opener (not shown) for opening the pod 50 by detaching the door 51 off the pod 50.

The operation of the CVD apparatus in accordance with a preferred embodiment of the present invention will now be described with reference to FIGS. 5 to 8.

As depicted in FIG. 5, the first boat 30 supported by the first boat elevator 20 is retired in the first retreat stage 5 while the second boat 30A supported by the second boat elevator 20A is loaded into and processed in the processing room 12 of the process tube 11.

Figure 6:
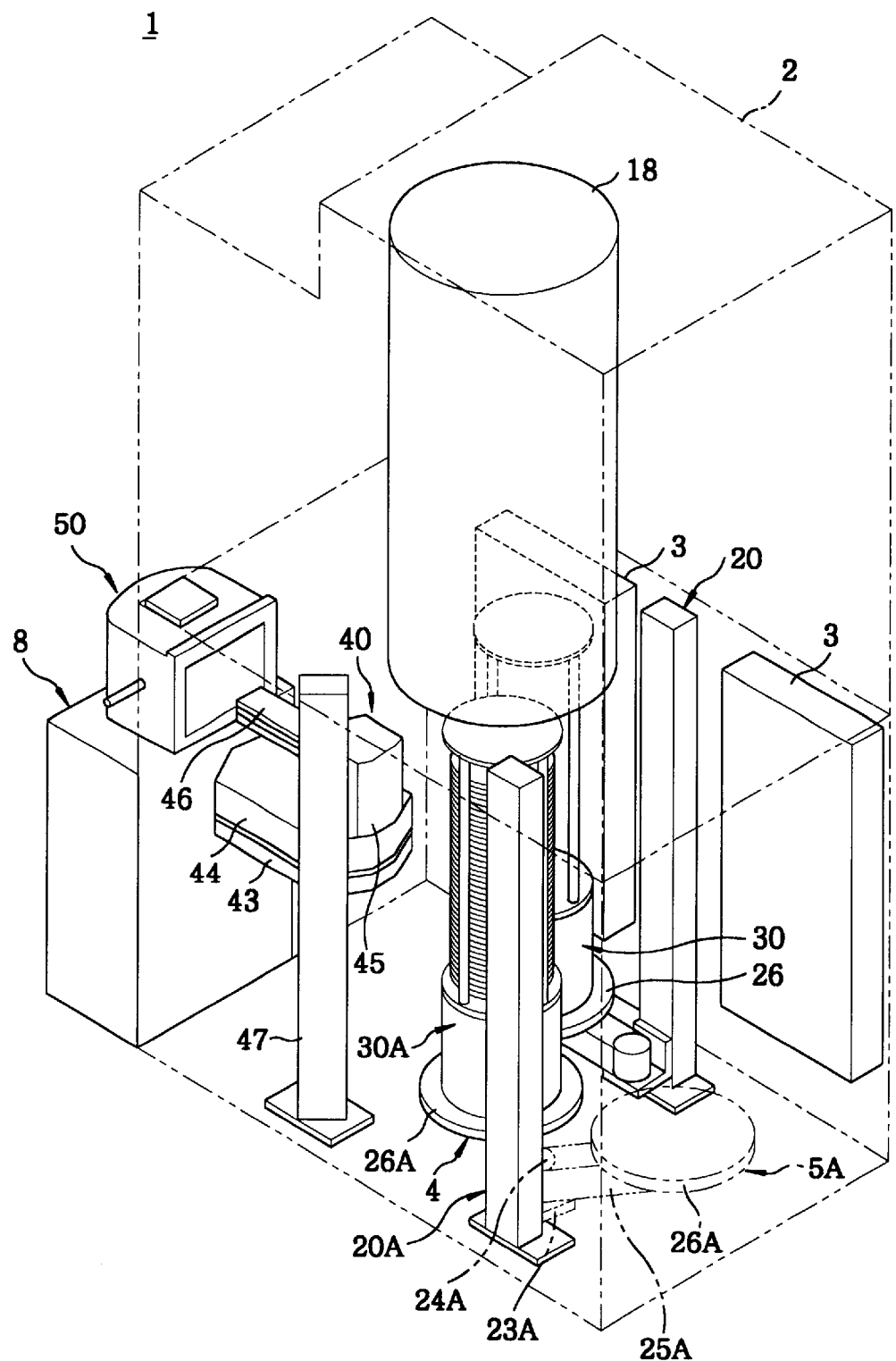
FIG. 6 sets forth a schematic view of the CVD apparatus after unloading the second boat.

After a desired processing is completed, as illustrated in FIG. 6, a cap 26A supporting the second boat 30A is descended by the second boat elevator 20A, thereby unloading the second boat 30A from the processing room 12 of the process tube 11. After the second boat 30A is unloaded, the throat 13 is closed by a shutter (not shown) to prevent the high temperature condition inside the processing room 12 from being destroyed. The second boat 30A unloaded from the processing room 12 (from now on referred to as also a processed boat 30A) and the wafers therein are at a high temperature state.

Figure 7:
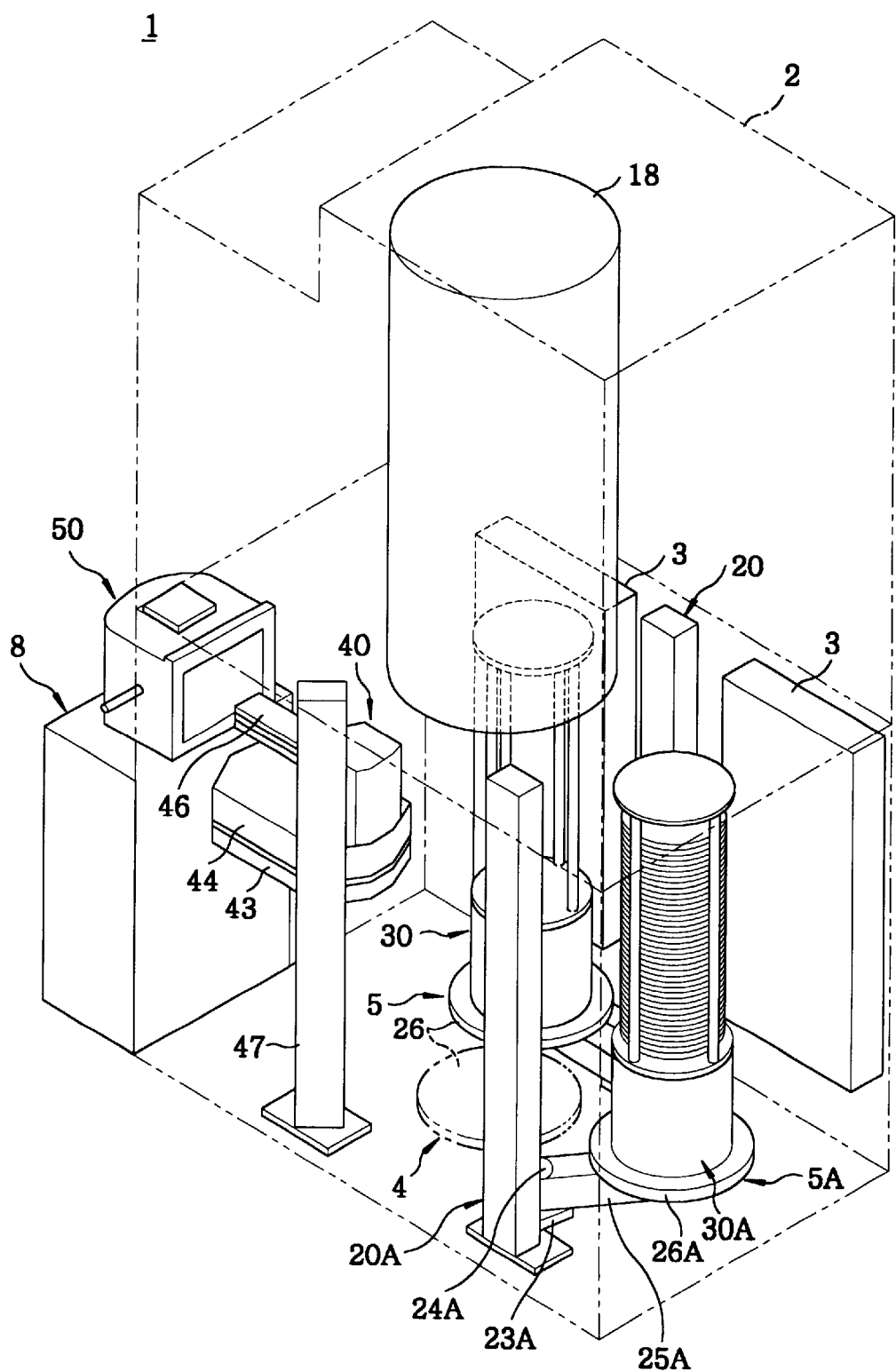
FIG. 7 represents a schematic view of the CVD apparatus after retreat of the second boat.

As represented in FIG. 7, the high temperature processed boat 30A unloaded from the processing room 12 is removed from the heat treatment stage 4 located at the axial line of the process tube 11 to the second retreat stage 5A by a rotary actuator 24A of the second boat elevator 20A. Since the second retreat stage 5A is located around an outlet of the clean unit 3 outputting clean air, the high temperature processed boat 30A placed at the second retreat stage 5A is effectively cooled down by the clean air outputted from the clean unit 3.

When the processed boat 30A is transferred to the second retreat stage 5A by the second boat elevator 20A, the empty first boat 30 without carrying any wafer therein is transferred from the first retreat stage 5 to the heat treatment stage 4 by the rotary actuator 24 of the first boat elevator 20. After the empty first boat 30 is transferred to the heat treatment stage 4, the wafers W in the pod 50 are transferred to the first boat 30 by the wafer transfer unit 40. Since the processed boat 30A placed at the second retreat stage 5A can be sufficiently cooled down by the clean unit 3 before wafer transfer process starts, the wafers being transferred may not be thermally affected by the processed boat 30A located at the heat treatment stage 4.

Figure 8:
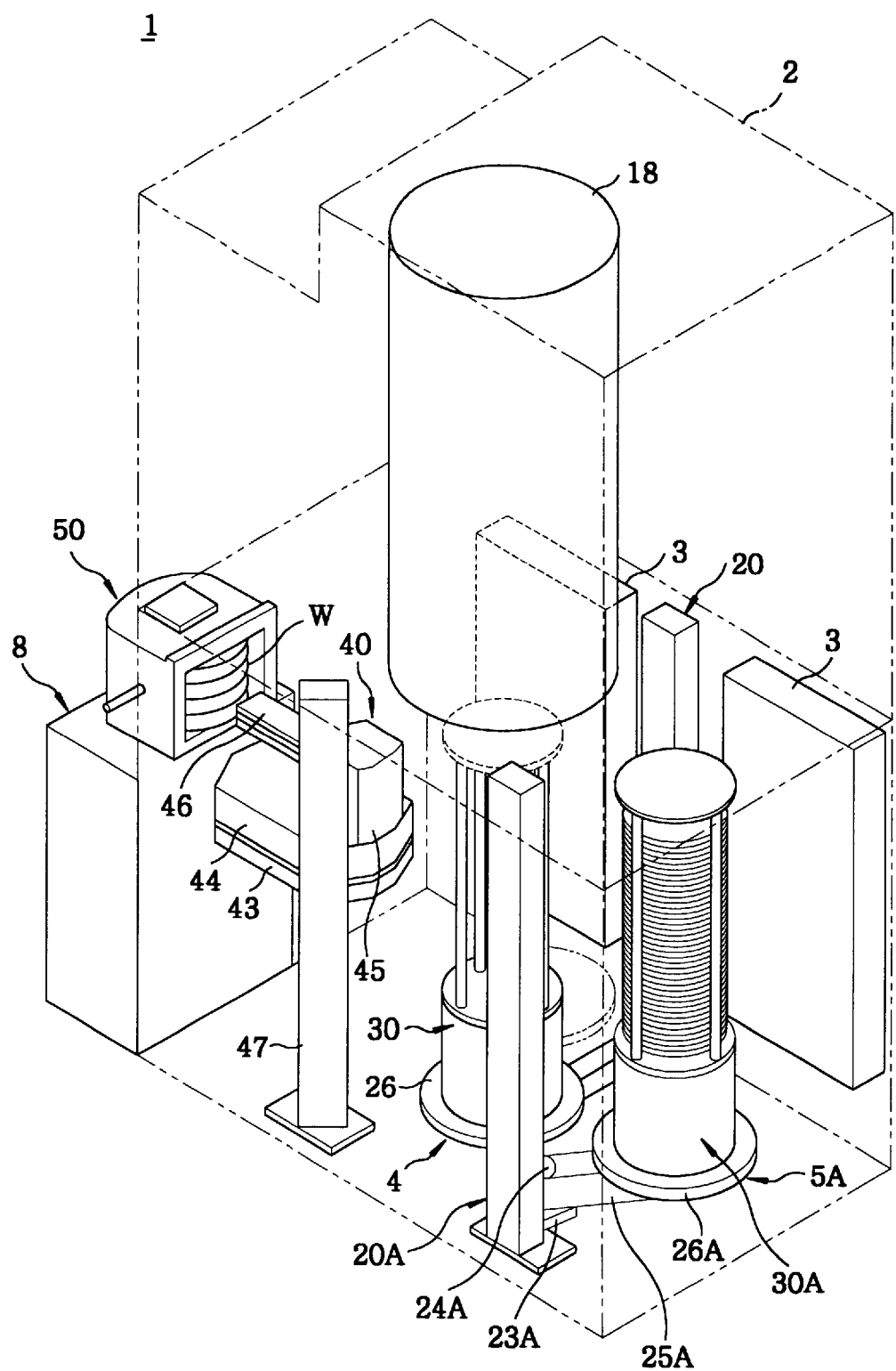
FIG. 8 exemplifies a schematic view of the CVD apparatus during a wafer transferring process by employing a first boat in accordance with the first CVD apparatus managing method.

As presented in FIG. 8, when the wafers W are transferred to the boat by the wafer transfer unit 40, the pod 50 provided on the pod stage 8 is opened by opening the door 51 through a release operation of a pod opener (not shown). After the pod 50 is opened, the wafer transfer unit 40 transfers the wafers W from the pod 50 to the first boat 30 via the notch arrangement unit 9.

That is, as can be seen from FIGS. 4A and 4B, the second linear actuator 44 and the installation unit 45 are moved toward the pod 50. Then the tweezers 46 are inserted into the pod 50 to pick up the wafers W in the pod 50 therewith. Thereafter, the second linear actuator 44 and the installation unit 45 are retracted to a position as shown in FIG. 4A. Subsequently, the rotary actuator 42 rotates about 90° and the second linear actuator 44 and the installation unit 45 are moved toward the notch arrangement unit 9. Then, the wafers W on the tweezers 46 are loaded into the notch arrangement unit 9 by the operation of the elevator 47.

After the notch arrangement of the wafers W is completed at the notch arrangement unit 9, the wafer transfer unit 40 picks up the wafers W from the notch arrangement unit 9 by employing the tweezers 46 and then retracts the tweezers 46 to the location shown in FIG. 4A.

Thereafter, the rotary actuator 42 is rotated about 90° and the second linear actuator 44 and the installation unit 45 are extended toward the heat treatment stage 4. Then, the wafers W on the tweezers 46 are transferred into the wafer holding slots 34 of the boat 30. Thereafter, the wafer transfer unit 40 retreats the second linear actuator 44 and the installation unit 45 and rotates the rotary actuator 42 by about 180°. Then, the tweezers 46 are arranged to face toward the pod 50 as the state shown in FIG. 4A.

Since the wafer transfer unit 40 has five tweezers 46, the wafer transfer unit 40 can transfer five wafers W at a time from the five slots of the pod 50 to the five wafer holding slots 34 of the boat 30. In this case, since the number (e.g., 100 to 200) of wafers processed in batch on the boat 30 is greater than that (e.g., 25) accommodated in one pod 50, the wafer transfer unit 40 mounts a preset number of wafers W from a plurality of pods 50 to be transferred to one boat by the operation of the elevator 47. If the wafers in the pod 50 are notch-arranged, the wafer transfer unit 40 transfers the wafers W from the pod 50 to the boat 30 without passing through the notch arrangement unit 9.

After the preset number of wafers W are mounted on the first boat 30, the first boat 30 is lifted and loaded into the processing room 12 of the process tube 11 by the elevator 20 as illustrated in FIG. 3. When the first boat 30 moves up to an upper limit, the periphery portion of the upper surface of the cap 26 and the bottom surface of the manifold 14 are tightly coupled with the seal ring 15 intervening therebetween, thereby air-tightly sealing the processing room 12.

Under a condition that the processing room 12 is airtightly closed by the cap 26, the processing room 12 is evacuated to achieve a predetermined vacuum level. Then the processing room 12 is heated to a predetermined processing temperature (e.g., 800° C. to 1000° C.) and a processing gas of a preset flow rate is fed into the processing room 12 through the gas inlet line 17. As a result, a CVD film is formed on each wafer W by the CVD reaction.

The processed boat 30A located at the second retreat stage 5A is transferred to the heat treatment stage 4 by the rotary actuator 24A of the second boat elevator 20A while the first boat 30 is processed in the processing room 12 of the process tube 11. At this time, the processed boat 30A is fully cooled down so that it is maintained at a temperature lower than, e.g., about 150° C. Three supporting members 33 of the processed boat 30A transferred in the heat treatment stage 4 are kept open towards the wafer transfer unit 40 as shown in FIG. 1.

After the processed boat 30A is transferred to the heat treatment stage 4 by the second boat elevator 20A, the wafer transfer unit 40 takes the wafers W from the processed boat 30A at the heat treatment stage 4 to transfer them to the empty pod 50 of the pod stage 8. In this case, since the number of the wafers W processed in a batch of the processed boat 30A is greater than that which can be accommodated in one pod 50, the wafer transfer unit 40 transfers the wafers W from the processed boat 30A to plural pods on the pod stage 8. When a preset number of wafers W are transferred to one empty pod 50, the pod holding the loaded wafers is released from the pod stage 8 and then transferred to another place.

After all the processed wafers W are transferred from the processed boat 30A to the pods 50, the empty second boat 30A is transferred to the second retreat stage 5A by the second boat elevator 20A and remains thereat until a next operation begins.

Meanwhile, when a predetermined time for the first boat 30 lapses, the cap 26 supporting the first boat 30 is lowered down by the first boat elevator 20. As a result, the first boat 30 is unloaded from the processing room 12 of the process tube 11. Thereafter, the throat 13 thereof is closed by the shutter (not shown) to sustain the high temperature condition of the processing room 12. The first boat 30 unloaded from the processing room 12 and wafers W accommodated by the first boat 30 are at a high temperature state.

As described above with respect to the second boat 30A, the processed first boat 30 being at a high temperature and unloaded from the processing room 12 is transferred from the heat treatment stage 4 toward the first retreat stage 5 by the rotary actuator 24 of the first boat elevator 20. Since the first retreat stage is positioned close to the outlet of the clean unit 3 outputting clean air, the processed first boat 30 transferred to the first retreat stage 5 can be effectively cooled down by the clean air outputted from the clean unit 3.

The wafers W are batch-processed by the CVD apparatus 1 by repeating the process described above. In the preferred embodiment of the present invention described above, wafers to be processed are loaded in an empty boat after transferring the processed boat to the retreat stage. However, wafers to be processed may be transferred to a boat while other wafers are being processed in the process tube if the film to be deposited is not thermally sensitive.

The advantages and effects in accordance with the above-mentioned preferred embodiment of the present invention are as follows.

(1) Since two boats are employed, a film growing process for wafers in one boat and a wafer transferring process for the other boat can be accomplished simultaneously, thereby enhancing throughput of the CVD apparatus.

(2) Since the alternate use of two boats in processing wafers in the process tube is accomplished by configuring each of the two boat elevators to load and unload one boat into and from the process tube by moving between the heat treatment stage and the retreat stage, a boat need not be detached from a corresponding boat elevator and therefore can be fixedly mounted thereon. As a result, alternate operation of the two boats can be executed continuously without suffering from a misalignment of the wafers and particulate generation problem due to the movement of the boats against the boat elevators.

(3) Since each of two boats is configured to move between the heat treatment stage and the retreat stage by employing a rotary actuator mounted on an elevator support unit of the corresponding boat elevator, two boats can move independently by using simply structured boat elevators, thereby reducing a manufacturing cost of the CVD apparatus.

(4) Since a boat is fixedly mounted on the cap supported by an arm of a corresponding boat elevator, a boat can be protected from tripping or falling down, e.g., due to an earthquake and therefore it becomes possible to prevent the damage generation of wafers or boats.

(5) The wafer transfer unit 40 and the boat elevators 20, 20A are configured to be located close to the heat treatment stage 4 in a manner of surrounding the heat treatment stage 4 in FIG. 1 and exchange operation of the processed boat with the empty boat is carried out between the first and second retreat stages and heat treatment stage. Accordingly, a radius of rotation of each arm of the first and second boat elevators can be decreased, enabling to reduce the footprint of the CVD apparatus by diminishing the (left/right and front/back) dimension of the housing body of the CVD apparatus.

(6) By decreasing the volume of the housing body, the amount of clean air supplied by the clean unit can be reduced, resulting in a reduced initial investment and running cost (direct and indirect operation cost), which together with the throughput increase in (1) supra contributes to the decrease of the cost of ownership (COO). In this case, COO can be estimated as follows: COO=(an initial investment cost+running cost)/(the number of wafers until the end of depreciation).

(7) Since the processed boat at high temperature unloaded from the processing room of the process tube is immediately transferred by the boat elevator to the retreat located away from the heat treatment stage disposed at the center axis line of the process tube thereunder, new wafers being loaded on an empty boat located at the heat treatment stage are not thermally affected by the processed boat, thereby preventing the processing accuracy of the new wafers from being deteriorated due to the thermal influence from the processed boat.

(8) Since thermal influence from the processed boat to the new wafers is avoided, the temperature of the processing room during a period for loading/unloading wafers into/from the boat processing room need not be lowered, thereby preventing the drop of the throughput thereof.

(9) Since the thermal influence to the wafers is avoided, the accuracy of the heat treatment of the CVD apparatus is increased. Further, quality and reliability of semiconductor devices manufactured by employing such wafers are enhanced.

(10) Since the first and second retreat stage for receiving the processed boat at high temperatures are in front of the clean air outlet of the clean unit, the processed boat at a high temperature can be effectively cooled down, shortening the cooling time.

(11) The wafer transfer unit can transfer wafers accommodated in any of the boats at the heat treatment stage which is a boat loading and unloading position under the process tube, wafers can be transferred with respect to any of the first and the second boats at one heat treatment stage. This results in saving of a moving area of the substrate transfer unit to thereby decrease the footprint thereof.

(12) Since the first elevator and the second boat elevator are located at both sides of a line passing through a center of the process tube and the wafer transfer unit, the first boat elevator can move the first boat toward the wafer transfer unit and the second boat elevator can move the second boat toward the opposite side of the wafer transfer unit. This results in further decreasing of the footprint thereof.

(13) Since a center position of the process tube is disposed inside a triangle formed by connecting the position of the wafer transfer unit and the first and second boat elevators, the space between the first and the second boat elevators can be saved to thereby decrease a horizontal width of the CVD apparatus.

(14) Since the wafer transfer unit can transfer wafers accommodated in any of the first and second boats at the boat loading/unloading position under the process tube, wafers can be transferred with respect to any of the first and second boats at one heat treatment stage. This results in saving of a moving area of the wafer transfer unit apparatus to thereby decrease the footprint thereof.

(15) Since center positions of the first boat and the second boat are located at one side (e.g., left side) of a straight line passing through the wafer transfer unit and the center position of the process tube, the space between the first and the second boat elevators can be saved to thereby decrease a horizontal width of the CVD apparatus.

FIGS. 9 to 12 outline schematic views for describing a CVD apparatus managing method in accordance with a second preferred embodiment of the present invention.

The second CVD apparatus managing method is different from the first CVD apparatus managing method in that while one boat is being processed, unprocessed wafers are loaded on the other boat and then the other boat is transferred to a location above the retreat stage, thereby further suppressing the thermal influence from the processed boat to the unprocessed wafers.

Figure 9:
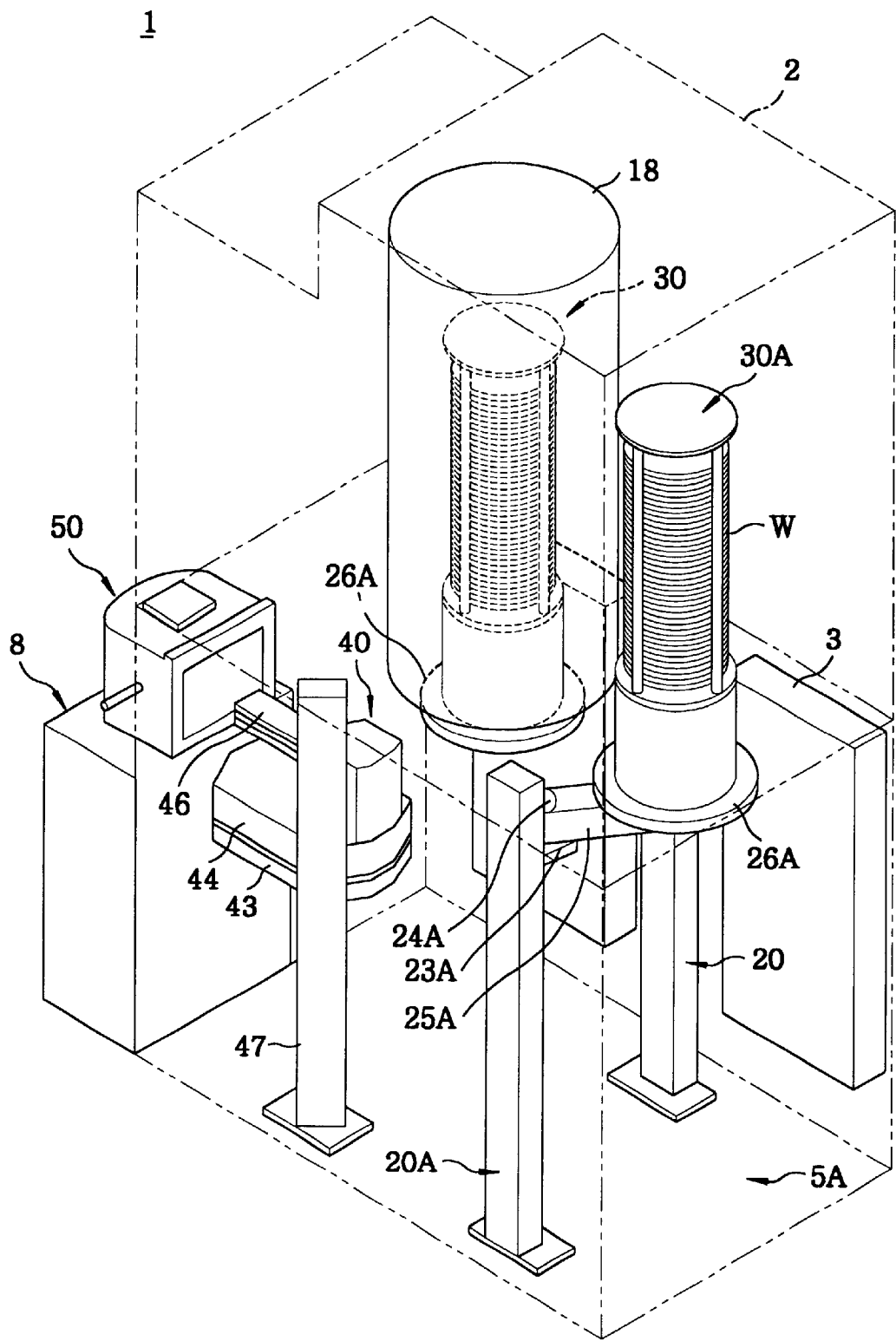
FIG. 9 outlines a schematic view of the CVD apparatus while retreating the second boat to a preset position above a wafer loading/unloading position which is used in describing a second CVD apparatus managing method.

That is, as depicted in FIG. 9, while the first boat 30 supported by the first boat elevator 20 is processed in the processing room 12 of the process tube 11, new wafers to be processed are loaded on the second boat 30A transferred to the heat treatment stage 4 and supported by the second boat elevator 20A. The second boat 30A accommodating the new wafers are transferred from the heat treatment stage 4 to the second retreat stage 5A by the rotary actuator 24A and then lifted to the upper position of the second retreat stage 5A by the second boat elevator 20A.

Figure 10:
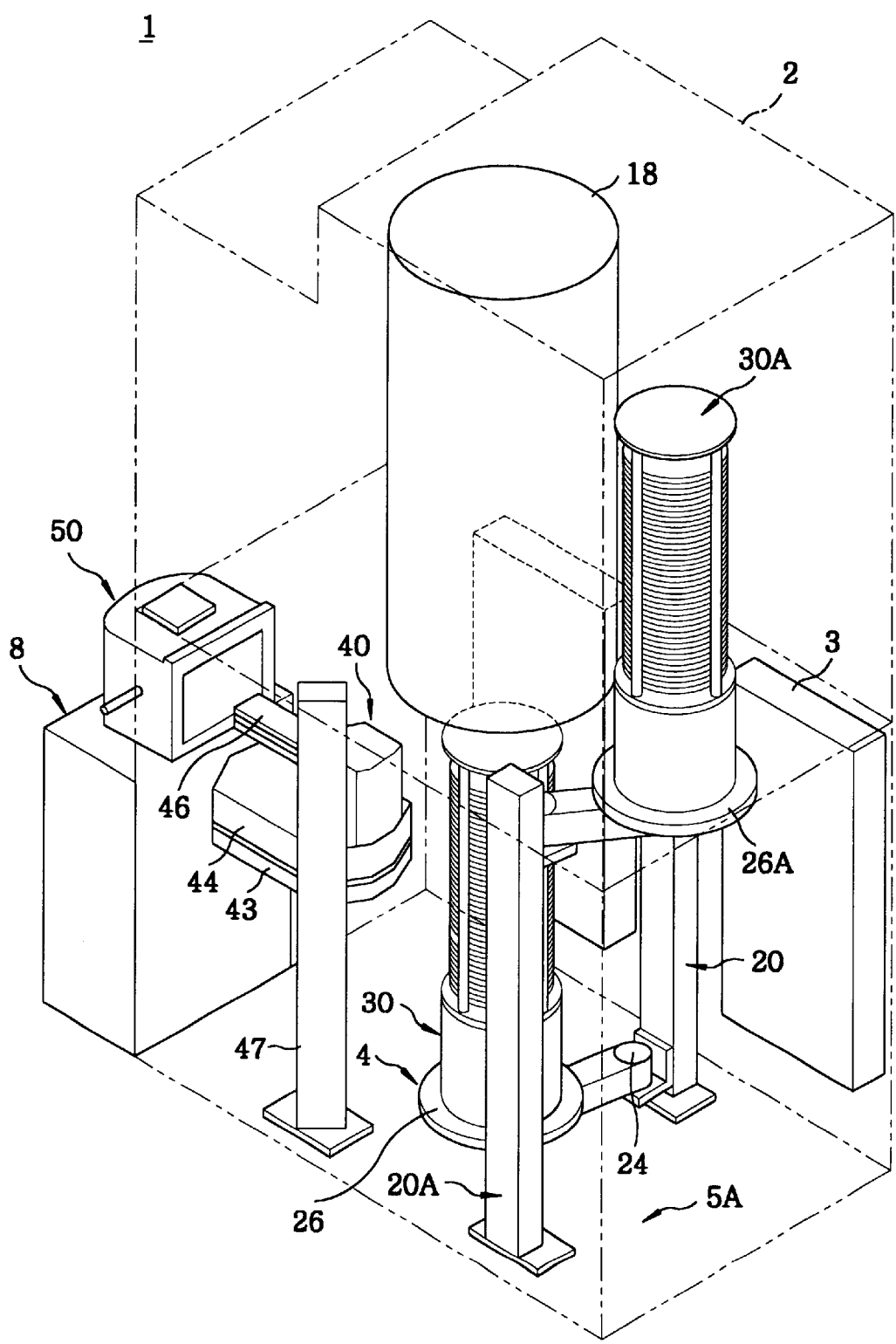
FIG. 10 gives a schematic view of the CVD apparatus after unloading of the first boat.

Thereafter, as set forth in FIG. 10, the processed first boat 30 is lowered by the first boat elevator 20. In this case, since the second boat 30A accommodating the new wafers W at the upper position of the second retreat stage 5A is farther away from the heat treatment stage 4, the new wafers W accommodated in the second boat 30A is prevented from being affected by the thermal influence from the processed first boat 30.

Figure 11:
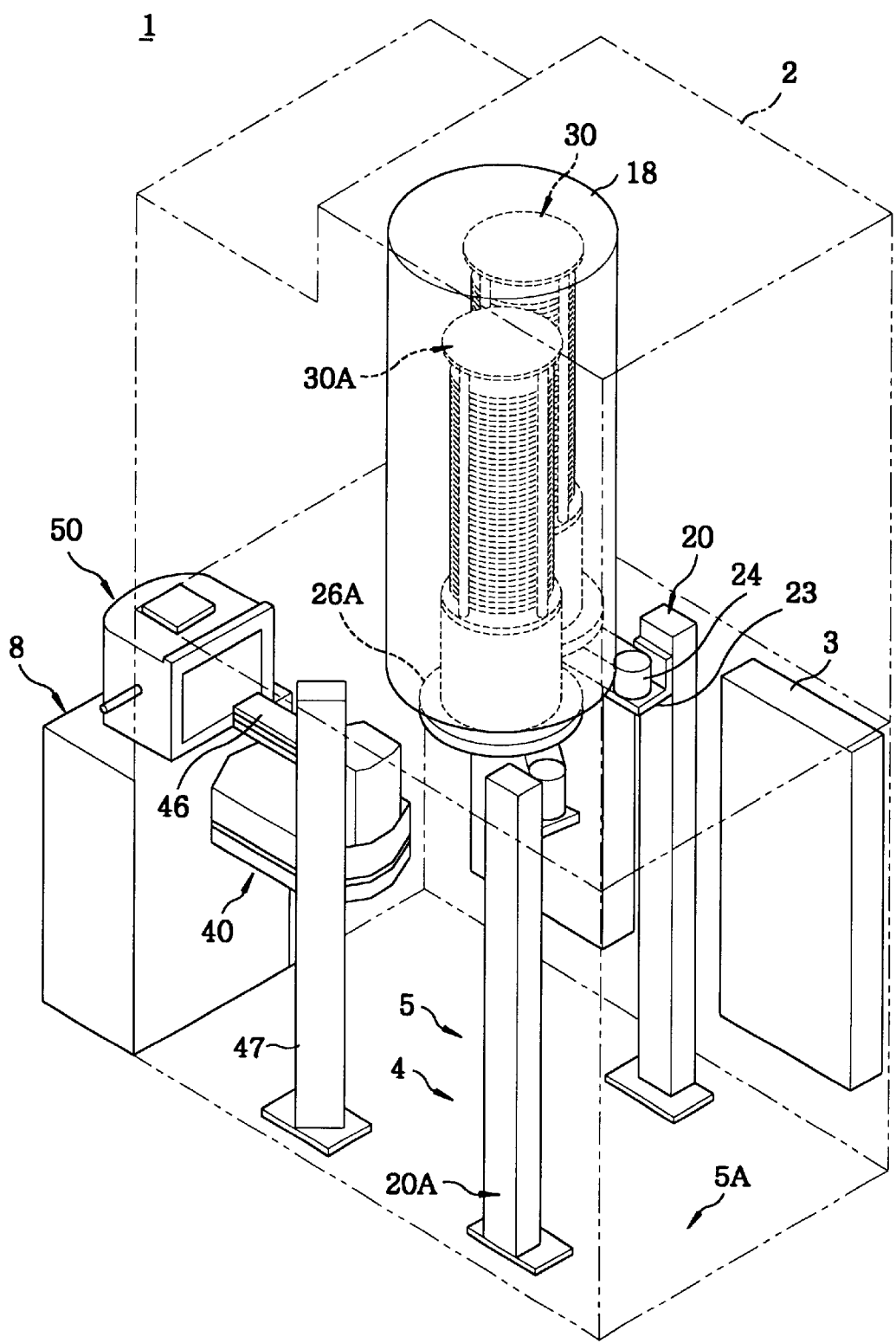
FIG. 11 represents a schematic view of the CVD apparatus while retreating the first boat to a preset position above a wafer loading/unloading position.

Thereafter, the processed first boat 30 is moved to an upper location of the first retreat stage 5 and the second boat 30A accommodating new wafers is loaded into the process tube 11. Then, while the second boat 30A supported by the second boat elevator 20A is processed in the processing room 12 of the process tube 11, the processed first boat 30 is returned to the heat treatment stage 4 and the processed wafers are unloaded from the first boat 30; and new wafers to be processed are mounted on the first boat 30 supported by the first boat elevator 20. Thereafter, the first boat 30 accommodating the new wafers are transferred from the heat treatment stage 4 to the first retreat stage 5 by the rotary actuator 24 and then moved to the upper position of the first retreat stage 5 by the first boat elevator 20 as shown in FIG. 11.

Figure 12:
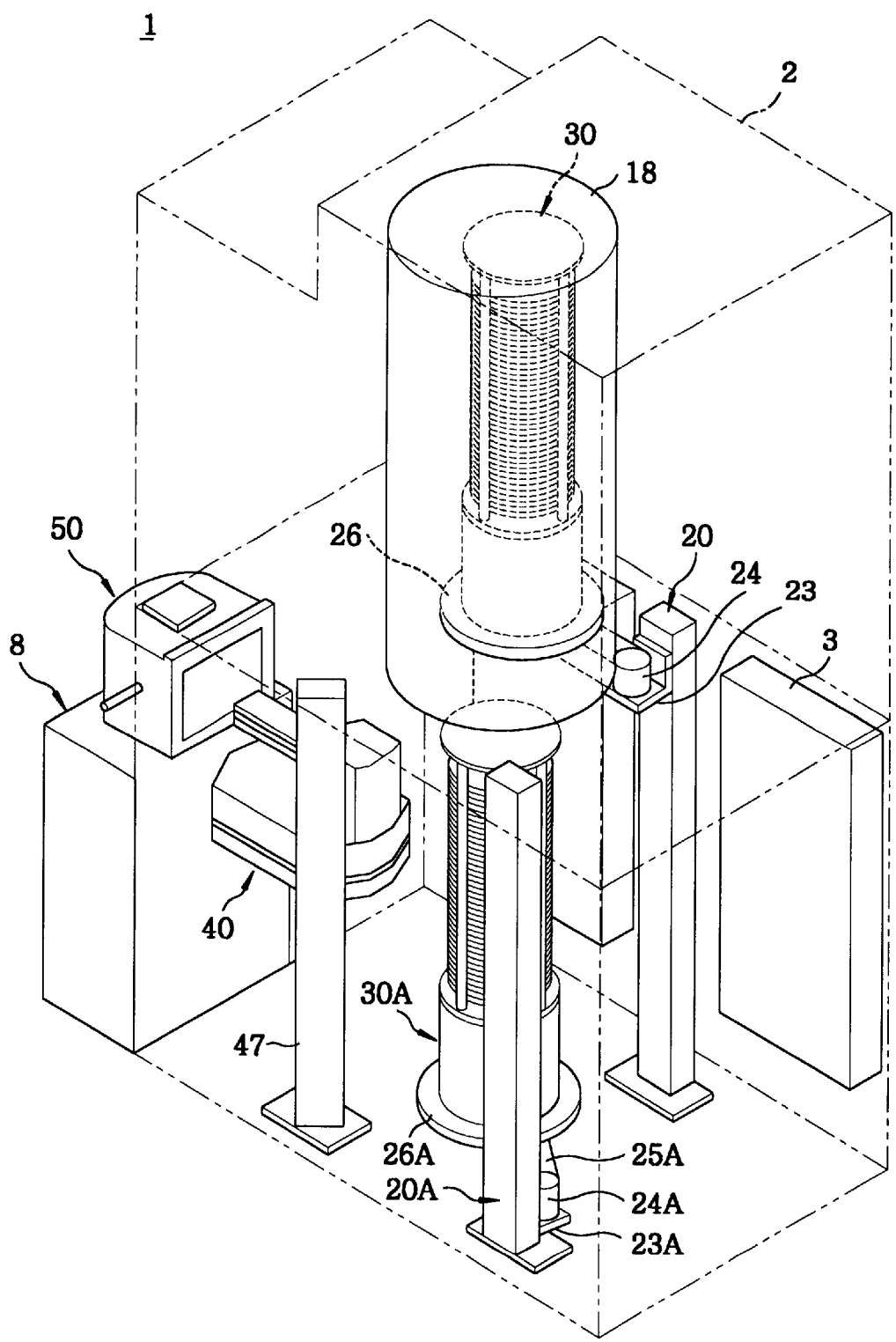
FIG. 12 sets forth a schematic view of the CVD apparatus after unloading the second boat in accordance with the second CVD apparatus managing method.

Next, as shown in FIG. 12, the processed second boat 30A is descended by the second boat elevator 20A. In this case, since the first boat 30 accommodating the new wafers W is moved at the upper position of the first retreat stage 5, which is farther away from the heat treatment stage 4, the new wafers W accommodated in the first boat 30 can be protected from the thermal influence from the processed second boat 30A at high temperature.

As described in the above, in accordance with the second CVD apparatus managing method, thermal influence from the processed boat to the new wafers can be further avoided in comparison with the first CVD apparatus managing method.

Figure 13:
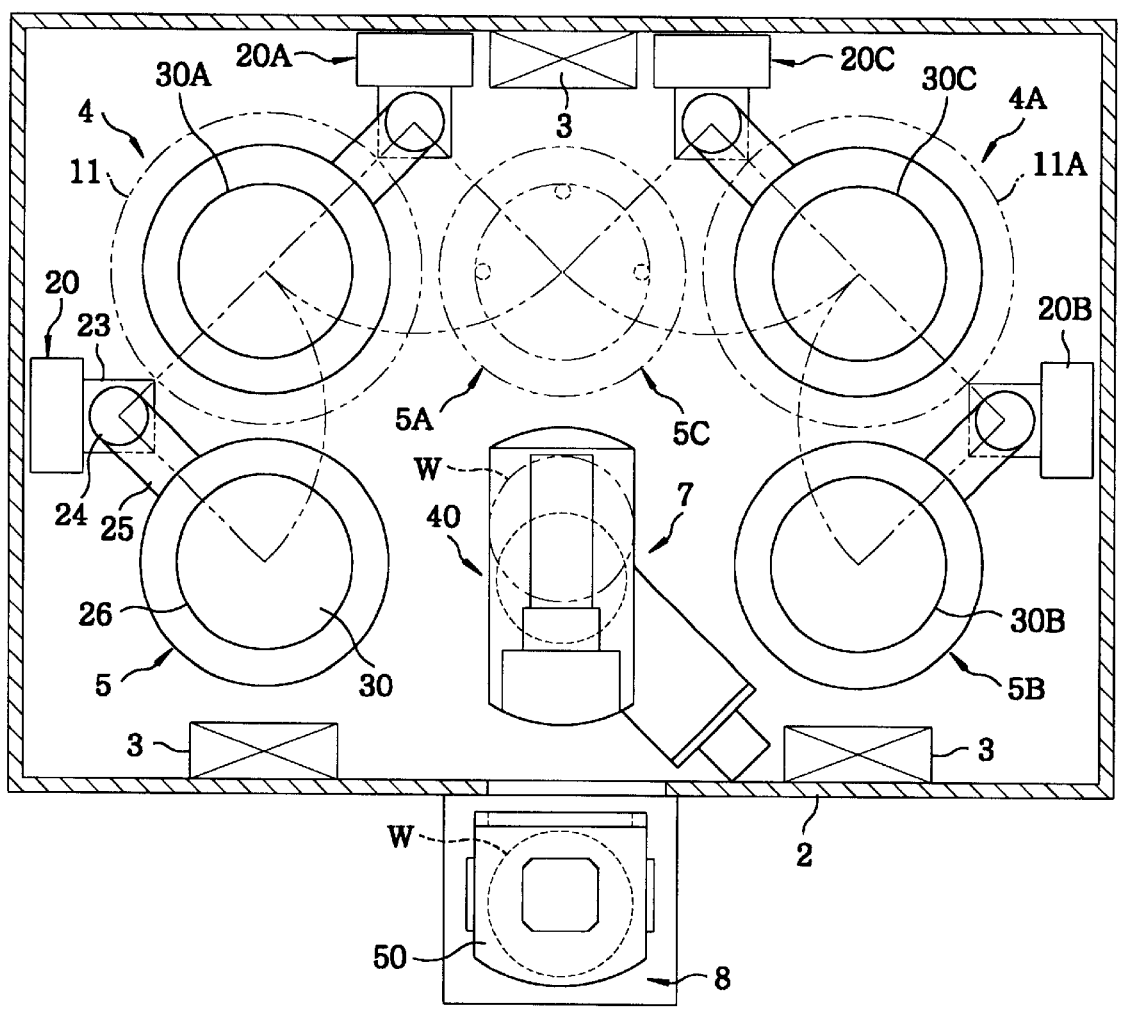
FIG. 13 presents a schematic plan view of a CVD apparatus in accordance with a second preferred embodiment of the present invention.

FIG. 13 presents a schematic top plan view of a CVD apparatus 1A in accordance with a second preferred embodiment of the present invention. The CVD apparatus 1A in accordance with the second preferred embodiment is different from the CVD apparatus 1 of the first preferred embodiment in that CVD apparatus 1A in accordance with the second preferred embodiment has two process tubes (including heater units), four boats, four boat elevators and three retreat stages. Referring to FIG. 13, the CVD apparatus 1A in accordance with the second preferred embodiment will be described in detail. In the following description, the side of a pod stage 8 will be referred to as the front side and its opposite side, as the backside.

A first heat treatment stage 4 and a second heat treatment stage 4A are set symmetrically at backside of the housing body 2 as illustrated in FIG. 13, wherein a first process tube 11 and a second process tube 11 are installed at the first heat treatment stage 4 and the second heat treatment stage 4A, respectively.

A first boat elevator 20 to carry a first boat 30 and a second boat elevator 20A to carry a second boat 30A are disposed diagonally with respect to the first heat treatment stage 4. A third boat elevator 20B to carry a third boat 30B and a fourth boat elevator 20C to carry a fourth boat 30C are disposed diagonally with respect to the second heat treatment stage 4A.

The first retreat stage 5 where the first boat 30 retreat is located at the front side of the first heat treatment stage 4; the second retreat stage SA for the second boat 30A, at the right hand side of the first heat treatment stage 4. A third retreat stage 5B for the third boat 30B is positioned at the front side of the second heat treatment stage 4A; a fourth retreat stage 5C for the fourth boat 30C is disposed at the left hand side of the second heat treatment stage 4A.

As presented in FIG. 13, the second retreat stage 5A and the fourth retreat stage 5C share the same space between the first heat treatment stage 4 and the second heat treatment stage 4A. The CVD apparatus 1A is provided with one wafer loading stage 7 at a front center region of the housing body 2. The wafer transfer unit 40 installed at the wafer loading stage 7 transfers wafers W between the first and the second heat treatment stages 4, 4A and the pod stage 8.

As shown, the boat elevators 20 and 20A are located at opposite sides with respect to the line connecting the process tube 11 and the wafer transfer unit 40; and the boat elevators 20B and 20C are located at opposite sides with respect to the line connecting the process tube 11A to the wafer transfer unit 40.

As can be seen from FIG. 13, the first heat treatment stage 4 is shared by the first and the second boat elevators 20, 20A and the second heat treatment stage 4A is shared by the third and the fourth boat elevators 20B, 20C. Further, the second and the fourth boat elevators 20A, 20C share one retreat stage located between the first and the second heat treatment stages 4, 4A.

Therefore, when the boat 30 is processed in the first process tube 11, the second boat 30A should be at its retreat stage 5A; the fourth boat 30C is to be in the second process tube 11; and the third boat 30B should be at its retreat stage 5B. Likewise, when the third boat 30B is processed in the second process tube 11A, the fourth boat 30C should be at its retreat stage 5C; the second boat 30A should be in the first process tube 11; and the first boat 30 should be at its retreat stage 5.

A CVD apparatus managing method of the CVD apparatus 1A in accordance with the second preferred embodiment is the same as that of the CVD apparatus 1 in accordance with the first preferred embodiment. The CVD apparatus 1A in accordance with the second preferred embodiment provides, in addition to the advantageous effects obtainable by the CVD apparatus 1 in accordance with the first preferred embodiment, further advantageous effects as follows.

(1) Since the CVD apparatus 1A in accordance with the second preferred embodiment employs two process tubes, four boat elevators and four boats, the throughput thereof can be enhanced.

(2) Since the second retreat stage 5A and the fourth retreat stage 5C occupy the same region between the first heat treatment stage 4 and the second heat treatment stage 4A, only three retreat stages are needed to thereby further decrease the footprint and the internal volume of the housing body 2.

(3) Only one wafer loading stage 7 is placed at a center front position of the housing body 2 and one wafer transfer unit 40 installed on the loading stage 7 is employed in transferring wafers W between the first and the second heat treatment stage4, 4A and the pod stage 8. Accordingly, the floor area and the internal volume of the housing body 2 can be reduced and required number of wafer transfer units also can be decreased.

(4) Based on the effects described in the above-mentioned items (2) and (3), initial cost and running cost for managing the CVD apparatus can be greatly reduced to thereby decrease the COO thereof.

Figure 14:
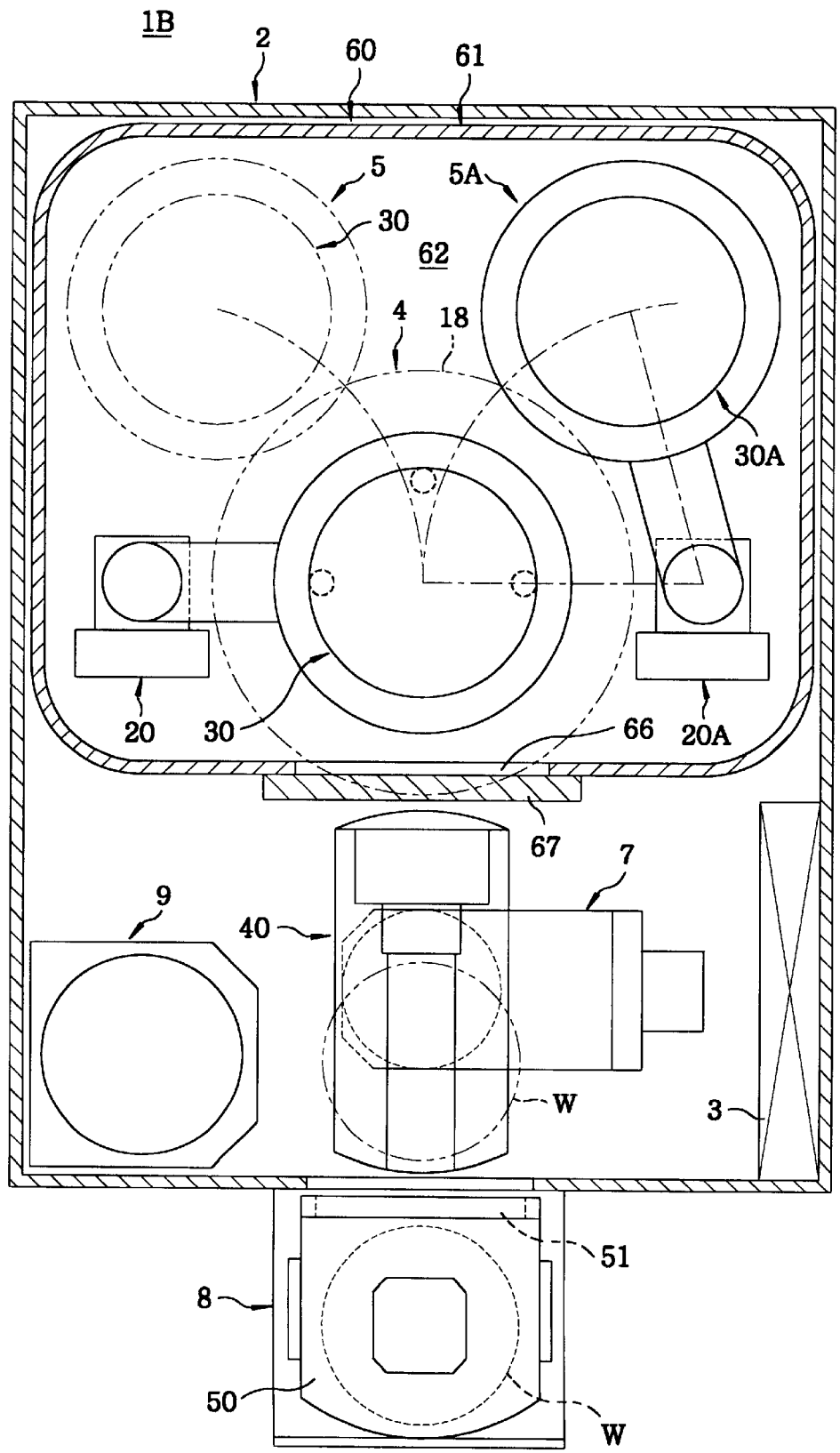
FIG. 14 depicts a schematic plan view of a CVD apparatus in accordance with a third preferred embodiment of the present invention.
Figure 15:
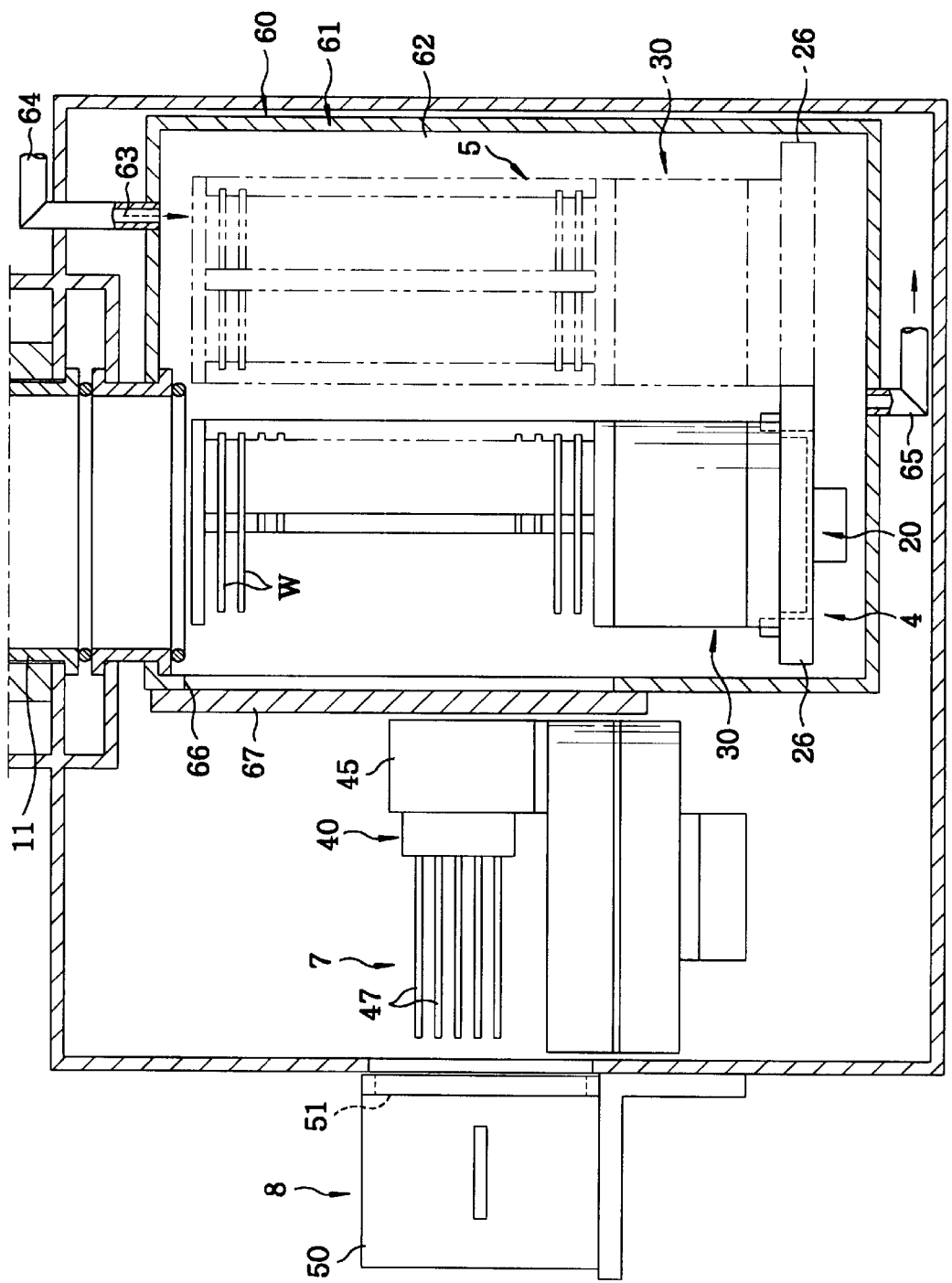
FIG. 15 shows a schematic sectional side view of the CVD apparatus in accordance with the third preferred embodiment of the present invention.

FIG. 14 depicts a schematic plan view of a CVD apparatus 1B in accordance with a third preferred embodiment of the present invention. FIG. 15 shows a schematic sectional side view of the CVD apparatus 1B.

The CVD apparatus 1B in accordance with the third preferred embodiment is different from the CVD apparatus 1, 1A in accordance with the first and the second preferred embodiments in that in the CVD apparatus 1B, there is provided in the space of the housing body 2 under the process tube 11 with a load-lock chamber structure 60 accommodating the space occupied by the heat treatment stage 4, the first and the second retreat stages 5, 5A and the first and the second boat elevators 22, 20A. From now on, the CVD apparatus 1B in accordance with the third preferred embodiment will be described focusing on the load-lock chamber structure 60. In the following description, a side of a pod stage 8 of FIG. 14 is defined as a front side; its opposite side, as a backside; a side of a notch arrangement unit 9, as a left side; and its opposite side as a right side.

As depicted in FIGS. 14 and 15, a load-lock chamber 61 (from now on referred to as a chamber 61) constituting a sealing room 62 is provided at a backside of the housing 2 under the process tube 11. The heat treatment stage 4 is located at a front center region of the sealing room 62. The first retreat stage 5 is positioned at left backside of the heat treatment stage 4. The second retreat stage 5A is located at right backside of the heat treatment stage 4. As can be seen FIG. 14, the heat treatment stage 4 is located close to the wafer transfer unit 40 but the retreat stages 5, 5A are located away from the wafer transfer unit 40.

A process tube 11 is installed at a position of the ceiling wall of the chamber 61 above the heat treatment stage 4 in the chamber 61, wherein the process tube 11 is connected to the sealing room 12. The first boat elevator 20 to transfer the first boat 30 is installed at left side of the heat treatment stage 4 and at front side of the first retreat stage 5. The second boat elevator 20A to transfer the second boat 30A is installed at right side of the heat treatment stage 4 and at front side of the second retreat stage 5A.

As depicted in FIG. 15, an inert gas supplying line 64 to supply inert gas 63 such as nitrogen gas into the sealing room 62 is connected at the ceiling of the chamber 61. An exhaust line 65 to exhaust gas from the sealing room 62 is installed at the bottom wall of the chamber 61. The sealing room 62 of the chamber 61 is purged by the inert gas 63. A wafer loading/unloading opening 66 is installed on front wall of an upper part of the chamber 61 to connect the sealing room 62 to a front side room of the housing body 2. A gate valve 67 is installed at the wafer loading/unloading opening 66 to open and close the wafer loading/unloading opening 66 when needed.

When the gate valve 67 opens the wafer loading/unloading opening 66, the wafer transfer unit 40 installed on the loading stage 7 located in the front side room of the housing body 2 carries (charges or discharges) wafers W through the wafer loading/unloading opening 66 to the first boat 30 or the second boat 30A transferred to the heat treatment stage 4.

A CVD apparatus managing method of the CVD apparatus 1B of the third preferred embodiment is the same as the first or the second CVD apparatus managing method except that the chamber 61 is purged with an inert gas. Normally, the wafer loading/unloading opening 66 is closed by the gate valve 67 and the sealing room 62 of the chamber 61 is purged by the inert gas 63 fed therein through the inert gas supply line 64 and evacuated therefrom through the exhaust line 65. When the wafers W are transferred by the wafer transfer unit 40 to and from the first boat 30 or the second boat 30A which are carried to the heat treatment stage 4, the wafer loading/unloading opening 66 is opened by the gate valve 67.

The CVD apparatus 1B in accordance with the third preferred embodiment provides, as well as the advantageous effects obtainable by the CVD apparatus in accordance with the first and the second preferred embodiment, further advantages and effects as follows.

(1) Since the heat treatment stage, the first retreat stage and the second retreat stage constitute a load-lock chamber which is purged by an inert gas, the wafers W are prevented from making contact with oxygen and moisture contained in air before and after the heat treatment thereof. Accordingly, unnecessary oxide film (natural oxide film) formation on the wafers W due to oxygen or moisture in the ambient air can be effectively prevented.

(2) Owing to the effect described in item (1), the accuracy of the heat treatment of the CVD apparatus can be greatly enhanced to thereby increase quality and reliability of the semiconductor device manufactured by using the wafers in accordance with the present invention.

(3) Since wafers can be transferred to and from one boat while the other boat is processed in the process tube, time needed to purge the chamber with the inert gas can be reduced. As a result, overall heat treatment time can be reduced to thereby enhance performance of the CVD apparatus and decrease the running cost thereof.

For example, even though the present invention has been described with respect to the batch-type vertical hot-wall CVD apparatus, the present invention is not limited thereto and can be also equally applied to a heat treatment apparatus such as a batch-type vertical diffusion apparatus or other types of semiconductor manufacturing apparatus as well.

The present invention can also be employed in processing other types of substrates including a photo mask, a printed circuit board, a liquid crystal panel, a compact disk, a magnetic disk and the like.

While the present invention has been described with respect to certain preferred embodiments only, other modifications and variations may be made without departing from the spirit and scope of the present invention as set forth in the following claims.

What is claimed is:

1. A substrate processing apparatus comprising:
   a process tube for processing a plurality of substrates;
   two boats for accommodating the substrates;
   two boat elevators, each having one boat mounted thereon, the boat elevators carrying the boats between a first position located below the process tube and two corresponding second positions and loading and unloading the boats into and from the process tube at the first position; and
   a substrate transfer unit for loading and unloading the substrates into and from the boats when the boats are at the first position,
   wherein a center position of the process tube is disposed inside a triangle formed by connecting the substrate transfer unit and the two boat elevators.

2. The apparatus of claim 1, wherein center positions of the boats at the second positions are located at one side of a straight line passing through the substrate transfer unit and the center position of the process tube.

3. The apparatus of claim 1, further comprising a clean unit located in front of each second position to supply clean air to a boat carried thereto.

4. A substrate processing apparatus comprising:
   a process tube for processing a plurality of substrates;
   two boats for accommodating the substrates;
   two boat elevators for carrying the boats between a first position located below the process tube and two corresponding second positions and loading and unloading the boats into and from the process tube at the first position; and
   a substrate transfer unit for loading and unloading the substrates into and from the boats,
   wherein the boat elevators are located at both sides of a line passing through a center of the process tube and the substrate transfer unit and one of the boats is moved by its corresponding boat elevator toward the substrate transfer unit from the first position and the other boat is moved by its corresponding boat elevator toward the opposite side of the substrate transfer unit from the first position.

5. The apparatus of claim 4, wherein the substrates are loaded and unloaded into and from the boats when they are at the first position.

6. The apparatus of claim 4, wherein center positions of the boats at the second positions are located at one side of a straight line passing through the substrate transfer unit and the center position of the process tube.

7. The apparatus of claim 4, further comprising a clean unit located in front of each second position to supply clean air to a boat carried thereto.

8. A substrate processing apparatus comprising:

two process tubes for processing a plurality of substrates;

four boats for accommodating the substrates;

four boat elevators, each boat elevator for loading and unloading one of the boats into and from one of the process tubes and carrying said one of the boats between one of two first positions below the process tubes and one of three corresponding second positions; and a substrate transfer unit for loading and unloading the substrates into and from the boats.

9. A method for manufacturing a semiconductor device by employing a substrate processing apparatus including a process tube for processing a plurality of substrates, first and second boats for accommodating the substrates; two boat elevators for carrying the boats between a first position located below the process tube and two corresponding second positions and loading and unloading the boats into and from the process tube at the first position and a substrate transfer unit for loading and unloading the substrates into and from the boats, the boat elevators being located at both sides of a line passing through a center of the process tube and the substrate transfer unit and one of the boats being moved by its corresponding boat elevator toward the substrate transfer unit from the first position and the other boat being moved by its corresponding boat elevator toward the opposite side of the substrate transfer unit from the first position, the method comprising the steps of:

processing substrates accommodated in the first boat in the process tube;

unloading the first boat from the process tube; and processing substrates accommodated in the second boat in the process tube and unloading the processed substrates from the first boat while the substrates accommodated in the second boat are processed.

10. The apparatus of claim 9, wherein after substrates accommodated in the first boat are processed in the process tube, said first boat is unloaded from the process tube and transferred to one of the second positions and then substrates to be processed are loaded into the second boat.

11. The method of claim 9, wherein while substrates loaded in the first boat are processed in the process tube, substrates to be processed are loaded into the second boat.

12. The method of claim 11, wherein after the substrates to be processed are loaded into the second boat, the second boat is transferred by a corresponding boat elevator to a third position above one of the second positions.

* * * * *